(12) United States Patent
Zaiser

(10) Patent No.: US 11,837,571 B2
(45) Date of Patent: Dec. 5, 2023

(54) SEMICONDUCTOR MODULE COMPRISING A FIRST AND SECOND CONNECTING ELEMENT FOR CONNECTING A SEMICONDUCTOR CHIP, AND ALSO PRODUCTION METHOD

(71) Applicant: SIEMENS AKTIENGESELLSCHAFT, Munich (DE)

(72) Inventor: Georg Zaiser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 118 days.

(21) Appl. No.: 16/474,410

(22) PCT Filed: Nov. 28, 2017

(86) PCT No.: PCT/EP2017/080640
§ 371 (c)(1),
(2) Date: Jun. 27, 2019

(87) PCT Pub. No.: WO2018/121949
PCT Pub. Date: Jul. 5, 2018

(65) Prior Publication Data
US 2019/0348390 A1  Nov. 14, 2019

(30) Foreign Application Priority Data
Dec. 28, 2016  (EP) .................................. 16207050

(51) Int. Cl.
*H01L 23/00*   (2006.01)
(52) U.S. Cl.
CPC .............. *H01L 24/37* (2013.01); *H01L 24/32* (2013.01); *H01L 24/40* (2013.01); *H01L 24/48* (2013.01);
(Continued)

(58) Field of Classification Search
CPC ......... H01L 24/37; H01L 24/32; H01L 24/40; H01L 24/48; H01L 24/49; H01L 2224/32245; H01L 2224/40091
(Continued)

(56) References Cited

U.S. PATENT DOCUMENTS 5,637,922 A   6/1997  Fillion et al.
6,313,598 B1  11/2001 Tamba et al.
(Continued)

FOREIGN PATENT DOCUMENTS

DE            91 09 295 U1   10/1991
DE     10 2007 033 288 A1    1/2009
(Continued)

OTHER PUBLICATIONS

PCT International Search Report and Written Opinion of International Searching Authority dated May 20, 2019 corresponding to PCT International Application No. PCT/EP2017/080640 filed Nov. 28, 2017.

*Primary Examiner* — Nduka E Ojeh
*Assistant Examiner* — Laura M Dykes
(74) *Attorney, Agent, or Firm* — Henry M. Feiereisen LLC

(57) ABSTRACT

A semiconductor module includes a substrate, a semiconductor chip arranged on the substrate, and a first connecting element for electrically connecting the semiconductor chip to a conductor track and/or to a further component of the semiconductor module. At least part of the first connecting element lies in surface contact with the semiconductor chip and the substrate and also the conductor track and/or the further component. The semiconductor module includes a second connecting element for electrically connecting the semiconductor chip to the conductor track and/or to the (Continued)

further component. The second connecting element is configured in the form of a wire or a strip.

4 Claims, 1 Drawing Sheet

(52) U.S. Cl.
CPC .... *H01L 24/49* (2013.01); *H01L 2224/32245* (2013.01); *H01L 2224/40091* (2013.01)

(58) Field of Classification Search
USPC ........................................................ 257/676
See application file for complete search history.

(56) References Cited

U.S. PATENT DOCUMENTS

| | | | |
|---|---|---|---|
| 2004/0014309 A1* | 1/2004 | Nakanishi | H01L 24/24 438/614 |
| 2004/0217488 A1 | 11/2004 | Luechinger | |
| 2007/0035019 A1 | 2/2007 | Carney et al. | |
| 2007/0040252 A1 | 2/2007 | Hosseini | |
| 2007/0045745 A1* | 3/2007 | Ewe | H01L 25/074 257/356 |
| 2007/0246808 A1* | 10/2007 | Ewe | H01L 23/49524 257/E23.044 |
| 2009/0072379 A1 | 3/2009 | Ewe et al. | |
| 2009/0072413 A1* | 3/2009 | Mahler | H01L 21/6835 438/109 |
| 2009/0179313 A1* | 7/2009 | Quinones | H01L 23/49524 257/669 |
| 2010/0123248 A1* | 5/2010 | Yajima | C25D 5/10 257/741 |
| 2011/0049692 A1 | 3/2011 | Tzu | |
| 2011/0147953 A1 | 6/2011 | Haba et al. | |
| 2012/0155049 A1 | 6/2012 | Haba et al. | |

FOREIGN PATENT DOCUMENTS

| | | |
|---|---|---|
| DE | 10 2007 043 001 A1 | 3/2009 |
| DE | 10 2008 045 338 A1 | 4/2009 |
| EP | 2 423 958 A2 | 2/2012 |
| JP | H0955392 A | 2/1997 |
| JP | 2000091499 A | 3/2000 |
| JP | 2004336043 A | 11/2004 |
| JP | 2006066704 A | 3/2006 |
| JP | 2013515371 A | 5/2013 |
| JP | 2013546197 A | 12/2013 |
| WO | WO-2009034008 A2 * 3/2009 ............ H01L 24/90 |

* cited by examiner

SEMICONDUCTOR MODULE COMPRISING A FIRST AND SECOND CONNECTING ELEMENT FOR CONNECTING A SEMICONDUCTOR CHIP, AND ALSO PRODUCTION METHOD

CROSS-REFERENCES TO RELATED APPLICATIONS

This application is the U.S. National Stage of International Application No. PCT/EP2017/080640, filed Nov. 28, 2017, which designated the United States and has been published as International Publication No. WO 2018/121949 and which claims the priority of European Patent Application, Serial No. 16207050.2, filed Dec. 28, 2016, pursuant to 35 U.S.C. 119(a)-(d).

BACKGROUND OF THE INVENTION

The invention relates to a semiconductor module comprising a substrate, a semiconductor chip, which is arranged on the substrate, and a first connecting element for electrically connecting the semiconductor chip to a conductor track and/or to a further component of the semiconductor module, wherein at least part of the first connecting element lies in surface contact with the semiconductor chip and the substrate and the conductor track and/or the further component. The present invention also relates to a method for producing a semiconductor module.

The subject of interest here is semiconductor modules, which can, for example, be part of an electronics system or power electronics system. Such semiconductor modules comprise at least one semiconductor chip, which is arranged on a substrate. This semiconductor chip is electrically connected to further components of the semiconductor module. For example, the semiconductor chip can be connected to one or more conductor tracks, which are arranged on the substrate. Furthermore, the semiconductor chip can be electrically connected to further components or semiconductor chips of the semiconductor module. Different methods for the electrical contacting of the semiconductor chip are known from the prior art.

Bonding wires are frequently used for contacting semiconductor chips. However, here the point of contact between the bonding wire and the semiconductor chip is known to be a weak point. This is due to the fact that the contact surface is relatively small. Moreover, bonding wires have the drawback that electromagnetic interference can occur within the semiconductor module and thus electromagnetic compatibility (EMC) is not sufficiently guaranteed. In addition, the load in a bonding wire can increase the temperature. This can result in thermal expansion and hence in mechanical stress. This can then lead to damage.

Furthermore, it is known from the prior art to contact semiconductor chips with a strip, which can also be called a ribbon. Since the individual strips have a larger cross section than bonding wires, a lower number of strips is needed to realize the same conductor cross section than is the case with bonding wires. However, the contacting of the strips on the surface of the semiconductor chip requires a larger area. Thus, it is no longer possible to realize a better current-carrying capacity. Furthermore, neither can the irradiation of electromagnetic interference be excluded and it has been found that semiconductor modules tend to oscillate in certain operating states.

It is further known from the prior art to use flexible plates for contacting semiconductor chips. Herein, the semiconductor chip is contacted over a large area by a prefabricated connecting element, which can, for example, be in the form of a flexible plate. This enables the size of the contact surface to be increased significantly. However, the effective cross section of the connecting element is lower than is the case with bonding wires. Herein, it is only possible to improve the effective cross section by increasing the layer thickness of the connecting element or the flexible plate.

If, however, the connecting element is in a thin and flexible form, the elasticity and extension of the connecting element is good and the connecting element can undergo elastic deformation together with the semiconductor chip and thus no permanent deformation of the connecting element results. However, the low layer thickness means the current-carrying capacity of the connecting element is not sufficient. It can also be the case that the temperature rise within the connecting element increases and thus the performance capability of the semiconductor chip cannot be fully utilized. However, increasing the layer thickness of the connecting element may result in the connecting element no longer being sufficiently flexible to expand together with the semiconductor chip on temperature changes. Thus, it is not possible to guarantee sufficient robustness.

It is the object of the present invention to demonstrate how an electrical connection within a semiconductor module of the type mentioned in the introduction can be embodied in a more reliable way.

SUMMARY OF THE INVENTION

This object is achieved according to the invention by a semiconductor module and by a method with the features as claimed in the respective independent claims. Advantageous developments of the present invention are the subject matter of the dependent claims.

A semiconductor module according to the invention comprises a substrate. Furthermore, the semiconductor module comprises a semiconductor chip, which is arranged on the substrate. Furthermore, the semiconductor module comprises a first connecting element for electrically connecting the semiconductor chip to a conductor track and/or to a further component of the semiconductor module, wherein at least part of the first connecting element lies in surface contact with the semiconductor chip and the substrate and the conductor track and/or the further component. Finally, the semiconductor module comprises a second connecting element for electrically connecting the semiconductor chip to the conductor track and/or the further component, wherein the second connecting element is in the form of a wire or a strip.

The semiconductor module can, for example, be used for power electronics. The semiconductor module comprises the substrate, which can be formed from an electrically insulating material. The substrate is preferably made of a ceramic. The semiconductor chip is arranged on this substrate. The semiconductor chip is in particular an unhoused semiconductor element. The semiconductor chip, which can also be referred to in the plural, can, for example, be in the form of a diode, transistors of the like. Moreover, the semiconductor module can comprise conductor tracks, which are arranged on the substrate or which are applied to the substrate. Moreover, the semiconductor module can comprise further components or electronic components. The further components can be further semiconductor chips. In addition, the semiconductor module comprises the first electrical connecting element. This first electrical connecting element is used to connect the semiconductor chip electrically to a conductor track and/or to a further component. Herein, the first connecting element is formed such that it lies in surface contact on a part of the semiconductor chip and also on a part of the substrate. The first connecting element can also lie in surface contact with a part of the conductor track or the further component. The first connecting element can in particular be in the form of a laminated structure or flexible plate.

According to an essential aspect of the present invention, it is provided that, in addition to the first connecting element, the semiconductor module comprises a second connecting element. This second connecting element is also used to electrically connect the semiconductor chip to the conductor track and/or the further component. Herein, the second connecting element is in the form of a wire or strip. It can also be provided that the second connecting element comprises a plurality of wires and/or strips. For example, the second connecting element can be in the form of a bonding wire. Alternatively thereto, the second connecting element can be in the form of a strip (ribbon). The second connecting element significantly improves the current-carrying capacity of the first connecting element. Herein, the first connecting element is in particular used to provide a low-inductance commutation path as a result of which switching losses in the semiconductor chip are minimized. In addition, the first connecting element confers the advantage of low electromagnetic interference during switching operations. The second connecting element increases the current-carrying capacity of the electrical connection between the semiconductor chip and the conductor track and/or the further component. Thus, it is possible to provide a more reliable electrical connection for the semiconductor chip overall.

The second connecting element is preferably arranged on a side of the first connecting element facing away from the semiconductor chip. Thus, the wire or strip is applied as a parallel current path above the first connecting element. This results in lower temperature rises in the bonding wires or strips. The wire or the strip is also electrically connected to the first connecting element. Thus, improved contacting of the wire or of the strip can be achieved. If only one wire or one strip is used without the first connecting element, these are usually directly connected to the semiconductor chip. The relatively small contact surface arising thereby can result in the occurrence of damage. Thus, it is possible to provide a robust electrical connection.

In one embodiment, the first connecting element comprises an electrically insulating film and a metal layer applied to the film. For example, the first connecting element can be provided by means of the so-called SiPLIT® method (SiPLIT—Siemens Planar Interconnect Technology). Herein, initially the electrically insulating film can be applied to the semiconductor chip, the substrate and the conductor track and/or the further component such that it lies on these components. The film can then be structured accordingly. The metal layer can then be applied to this film. It can also be provided that the first connecting element is provided by means of so-called Skin® technology. Herein, the metal layer can be applied to a film by means of a sintering method. Hence, it is possible to use known methods for the production of the first connecting element.

According to a further embodiment, the first connecting element can have a flexible form. In principle, the first connecting element can be provided in that a flexible electrically conductive plate is applied to the components of the semiconductor module to be connected. Thus, for example, the contact surface can be significantly increased with the electrical connection. Furthermore, expansions caused by temperature fluctuations can be reliably compensated.

It is also advantageous for at least part of the second connecting element to have a predetermined curvature. In other words, parts of the wire or the strip can be in arched form. This embodiment of the second connecting element enables it to be achieved that said element has a certain elasticity. Thus, expansions of the individual components of the semiconductor module due to temperature differences can be compensated.

According to a further embodiment, the semiconductor module comprises at least one insulating element, which is arranged between the semiconductor chip and the first connecting element. This insulating element is preferably made of an electrically insulating material. In particular, this insulating element can be arranged on the edge regions of the semiconductor chip. Located on the edge regions of the semiconductor chip are corresponding structures of the semiconductor chip, which are responsible for the blocking capability. The insulating element can prevent these structures from being electrically connected. Thus, the insulating element can provide reliable edge insulation.

It is furthermore advantageous for the semiconductor module to comprise a baseplate, which is connected to the substrate on a side of the substrate facing away from the semiconductor chip. For example, the baseplate can be formed of a metal. The baseplate can also be formed of a material comprising silicon carbide and/or aluminum. The baseplate enables the heat generated during the operation of the semiconductor module or the semiconductor chip to be dissipated reliably.

Moreover, it can be provided that the semiconductor module comprises control circuits. In these control circuits, then only the first connecting element can be used for the electrical connection. There is usually a lower current load in these control circuits. Thus, electromagnetic interference or influences are excluded or minimized.

The semiconductor module can be used in a power electronics system or another electronic component. It can also be provided that the power electronics system or the electronic component comprises a plurality of semiconductor modules. The semiconductor chip can in particular be in the form of a transistor, for example a MOSFET or an IGBT. The semiconductor chip can also be in the form of a power semiconductor component.

A method according to the invention is used to produce a semiconductor module. Herein, a substrate is provided. Furthermore, a semiconductor chip is arranged on the substrate. Furthermore, a first connecting element for electrically connecting the semiconductor chip to a conductor track and/or to a further component of the semiconductor module is provided such that at least part of the first connecting element lies in surface contact with the semiconductor chip and the substrate and the conductor track and/or the further component. Moreover, a second connecting element for electrically connecting the semiconductor chip to the conductor track and/or the further component is provided, wherein the second connecting element is in the form of a wire or a strip. The method according to the invention can be used to produce a semiconductor module according to the invention.

Herein, it is in particular provided that initially at least part of the first connecting element is applied to the semiconductor chip and the substrate and the conductor track and/or the further component is applied and then at least part of the second connecting element is applied to the first connecting element. Thus, the first connecting element can be formed with a lower layer thickness than known first connecting elements or flexible plates. This simplifies the production process. Furthermore, the first connecting element has higher elasticity than known connecting elements and can also be applied more efficiently to the surface of the semiconductor chip. It is also possible to guarantee a reliable connection between the first connecting element and the semiconductor chip even with different thermal coefficients of expansion. Thus, it is possible to provide a robust and reliable connection overall.

According to a further embodiment, to provide the first connecting element, a metal layer is applied to a film by means of sintering, soldering and/or electroplating. As already explained, the first connecting element can be in the form of a laminated structure or a flexible plate. The first connecting element can comprise the electrically insulating film to which the metal layer is applied. The metal layer can, for example, be made of copper, aluminum, gold or the like. Thus, the first connecting element can be produced in a simple and reliable manner.

The preferred embodiments and the advantages thereof presented with reference to the semiconductor module according to the invention apply correspondingly to the method according to the invention.

BRIEF DESCRIPTION OF THE DRAWING

The invention is now explained in more detail with reference to preferred exemplary embodiments and with reference to the attached drawings, which show.

DETAILED DESCRIPTION OF PREFERRED EMBODIMENTS

Figure 1:
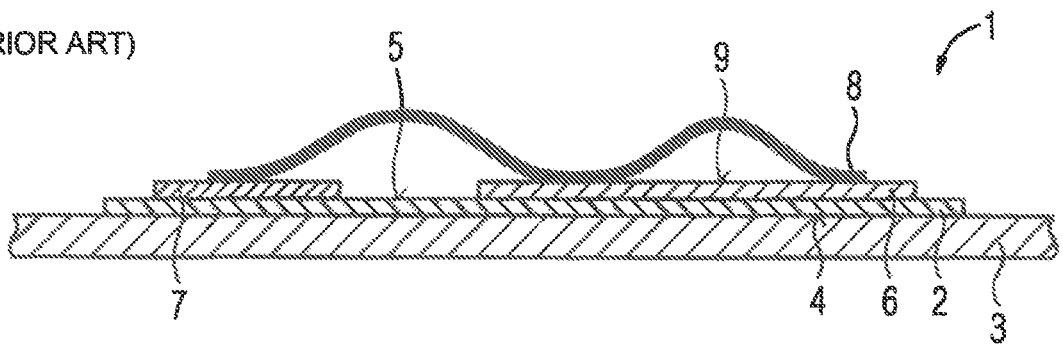
FIG. 1: a semiconductor module according to the prior art in a first embodiment.

In the figures, elements which are the same or have the same functions are given the same reference characters.

FIG. 1 shows a semiconductor module 1 according to the prior art in a first embodiment. Herein, the semiconductor module 1 is shown in a sectional side view. The semiconductor module 1 comprises a substrate 2 formed from an electrically insulating material. For example, the substrate 2 can be formed from a ceramic. Furthermore, the semiconductor module comprises 1 a baseplate 3, connected to an underside 4 of the substrate 2. The baseplate 3 can be formed of a metal. Located on an upper side 5 of the substrate 2, there is a semiconductor chip 6. The semiconductor chip 6 can also be referred to in the plural. Moreover, a conductor track 7 is located on the upper side 5 of the substrate 2. Herein, the semiconductor chip 6 is electrically connected to the conductor track by means of a bonding wire 8. Herein, the bonding wire 8 is arranged on an upper side 9 of the semiconductor chip 6. The semiconductor chip 6 can also be electrically connected to a conductive layer on its underside. The semiconductor chip 6 can be connected to a further component, or activate the same, by this conductive layer.

Figure 2:
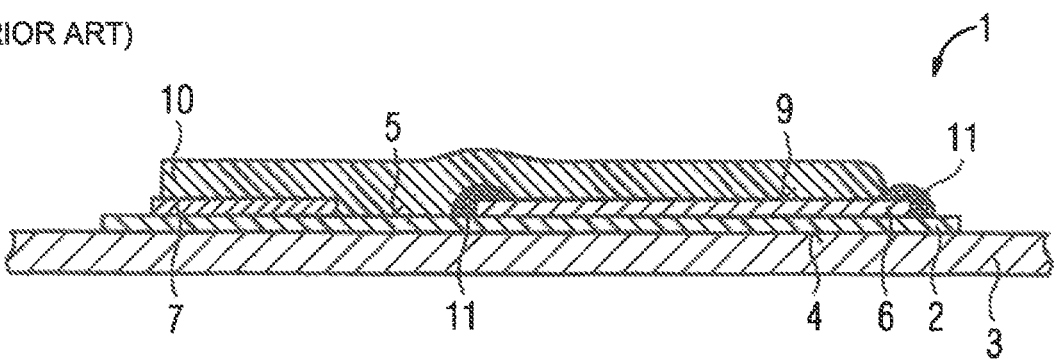
FIG. 2: a semiconductor module according to the prior art in a further embodiment.

FIG. 2 shows a semiconductor module 1 according to the prior art in a further embodiment. Compared to the semiconductor module 1 in FIG. 1, the semiconductor chip 6 and the conductor track 7 are connected to one another by a flexible connecting element 10. This flexible connecting element 10 lies in surface contact with the semiconductor chip 6, the substrate 2 and the conductor track 7. The connecting element 10 can, for example, be provided in that that a film is applied to the conductor track 7, the substrate 2 and the semiconductor chip 6. This film can then be structured accordingly. Then, a metal layer can be applied to the structured film. It can also be provided that the connecting element 10 is applied in the form of a flexible electrically conductive plate, which is applied to the conductor track 7, the substrate 2 and the semiconductor chip 6. Moreover, insulating elements 11 are provided, which are arranged between the semiconductor chip 6 and the connecting element 10. These insulating elements 11 are used for edge insulation.

Figure 3:
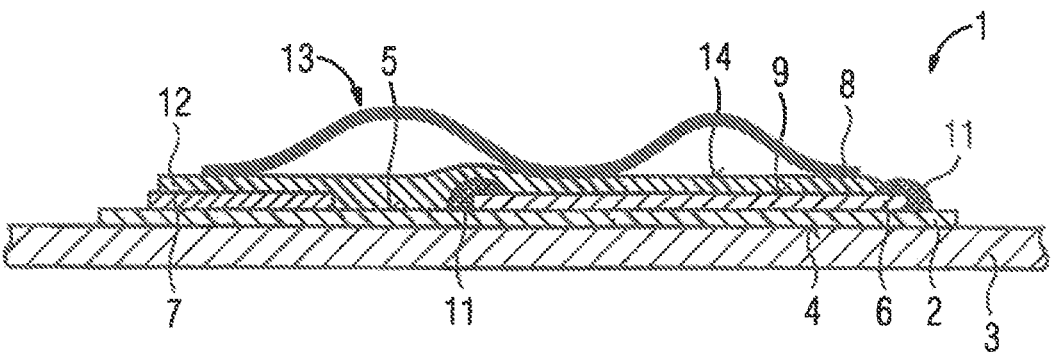
FIG. 3: a semiconductor module according to an embodiment of the present invention.

FIG. 3 shows a semiconductor module 1 according to an embodiment of the invention. Herein, the semiconductor module comprises a first connecting element 12 similar to the connecting element 10 shown in FIG. 2. Herein, the first connecting element 12 has a lower layer thickness than the connecting element 10. In addition, the semiconductor module 1 comprises a second connecting element 13, which in the present case is in the form of a bonding wire 8. It can also be provided that the second connecting element 13 is in the form of a strip. Herein, the second connecting element 13 is applied to an upper side 14 of the first connecting element 12. Moreover, insulating elements 11 are provided, which are arranged between the semiconductor chip 6 and the first connecting element 12. These insulating elements 11 are used for edge insulation.

Thus, the second connecting element 13 or the bonding wire 8 represents a parallel current path above the flexible plate or the first connecting element 12. Herein, the first connecting element 12 forms a low-inductance commutation path, which provides for frictionless commutation in the semiconductor chip 6. The second connecting element 13 or the bonding wire 6 can increase the current carrying capacity. Thus, a reliable and robust electrical connection can be provided between the semiconductor chip 6 and the conductor track 7. This connection can also be used to connect the semiconductor chip 8 to further components of the semiconductor module 1.

What is claimed is:

1. A semiconductor module, comprising:
   a substrate;
   a semiconductor chip arranged on the substrate;
   a first connecting element configured to electrically connect the semiconductor chip to a conductor track, at least part of the first connecting element lying in surface contact with the semiconductor chip and the substrate and the conductor track, said first connecting element comprising only a flexible electrically conductive plate forming a low-inductance commutation path for frictionless commutation in the semiconductor chip, the first connecting element undergoing elastic deformation together with the semiconductor chip with no permanent deformation of the first connecting element;
   a second connecting element configured to electrically connect the semiconductor chip to the conductor track, said second connecting element being in the form of a wire, wherein the first connecting element has a side facing away from the semiconductor chip, said second connecting element being arranged directly on said side of the first connecting element; and
   an insulating element arranged between the semiconductor chip and the first connecting element for edge insulation, and further comprising control circuits, wherein another first connecting element comprising only another flexible electrically conductive plate is used for electrical connections in the control circuits, the another first connecting element undergoing elastic deformation together with the semiconductor chip with no permanent deformation of the another first connecting element.

2. The semiconductor module of claim 1, wherein at least part of the second connecting element has a predetermined curvature.

3. The semiconductor module of claim 1, wherein the substrate has a side facing away from the semiconductor chip, and further comprising a baseplate connected to the substrate on said side of the substrate.

4. A method for producing a semiconductor module, comprising:
  arranging a semiconductor chip on a substrate;
  establishing only a flexible electrically conductive plate for a first connecting element, the first connecting element undergoing elastic deformation together with the semiconductor chip with no permanent deformation of the first connecting element;
  electrically connecting by the first connecting element the semiconductor chip to a conductor track such that at least part of the first connecting element lies in surface contact with the semiconductor chip and the substrate and the conductor track forming a low-inductance commutation path for frictionless commutation in the semiconductor chip;
  electrically connecting the semiconductor chip to the conductor track by a second connecting element in the form of a wire, wherein initially at least part of the first connecting element is applied to the semiconductor chip and the substrate and the conductor track, and then at least part of the second connecting element is applied directly to the first connecting element, and
  arranging an insulating element between the semiconductor chip and the first connecting element for edge insulation, and using another first connecting element comprising only another flexible electrically conductive plate for electrical connections in control circuits of the semiconductor module the another first connecting element undergoing elastic deformation together with the semiconductor chip with no permanent deformation of the another first connecting element.

* * * * *